(12) United States Patent
Takasugi et al.

(10) Patent No.: US 7,605,001 B2
(45) Date of Patent: Oct. 20, 2009

(54) METHOD OF MULTIDIMENSIONAL NMR WITH SIMULTANEOUS PLURAL MAGNETIZATION TRANSFER, AND NMR PULSE SEQUENCE THEREOF

(75) Inventors: Kenji Takasugi, Saitama (JP); Nobuaki Nemoto, Kanagawa (JP)

(73) Assignee: JEOL Ltd., Tokyo (JP)

( * ) Notice: Subject to any disclaimer, the term of this patent is extended or adjusted under 35 U.S.C. 154(b) by 775 days.

(21) Appl. No.: 11/265,039

(22) Filed: Nov. 2, 2005

(65) Prior Publication Data
US 2006/0099717 A1    May 11, 2006

(30) Foreign Application Priority Data
Nov. 10, 2004   (JP)   .............................. 2004-326596
Oct. 12, 2005   (JP)   .............................. 2005-297128

(51) Int. Cl.
*G01N 24/00*    (2006.01)
(52) U.S. Cl. ........................ 436/173; 324/307; 324/308; 324/314
(58) Field of Classification Search ........................ None
See application file for complete search history.

(56) References Cited

OTHER PUBLICATIONS

Yuxi Pang et al., "High-resolution detection of five frequencies in a single 3D spectrum: HNHCACO—a bidirectional coherence transfer experiment", *Journal of Biomolecular NMR*, 11 (1998), pp. 185-190.

*Primary Examiner*—Yelena G Gakh
(74) *Attorney, Agent, or Firm*—The Webb Law Firm (57) ABSTRACT

There is disclosed an NMR measurement method of observing plural magnetization transfer patterns in one experiment and observing their respective time-modulated, evolved chemical shifts. In an earlier portion of a pulse sequence, a transition is made from in-phase magnetizations to antiphase magnetizations using RF pulses. In an intermediate portion of the sequence, the antiphase magnetizations are interchanged using 90° RF pulses. In a later portion of the sequence, a transition is made from the antiphase magnetizations to the in-phase magnetizations using other RF pulses. Simultaneously with the interchange of the magnetizations, evolution of chemical shifts is performed by a constant-time evolution technique. In the earlier and later portions of the pulse sequence, evolutions of the chemical shifts can be performed simultaneously because the magnetizations of two nuclei are in lateral magnetization state.

10 Claims, 10 Drawing Sheets

METHOD OF MULTIDIMENSIONAL NMR WITH SIMULTANEOUS PLURAL MAGNETIZATION TRANSFER, AND NMR PULSE SEQUENCE THEREOF

BACKGROUND OF THE INVENTION

1. Field of the Invention

The present invention relates to a method and instrument for NMR (nuclear magnetic resonance) measurements. More particularly, the invention relates to an NMR measurement method and NMR pulse sequence for observing plural pathways and correlations simultaneously in multidimensional NMR spectroscopy.

2. Description of Related Art

In almost all multidimensional NMR measurements generally conducted heretofore, a certain one pathway is magnetized and transferred. Then, the magnetization is observed as a signal. That is, at the beginning of the experiment, a magnetization of some nucleus is excited and moved to another nucleus. Finally, the magnetization is brought to an observable nucleus.

In other measurements, there are plural magnetization transfer pathways to be measured. Some techniques of observing signals consisting of magnetizations made to follow plural pathways in this way have been reported. The method closest to the present invention is disclosed in Yuxi Pang et al., "High-resolution of five frequencies in a single 3D spectrum: HNHCACO-a Bidirectional Coherence Transfer Experiment", J. of Biomol. NMR, 11, 185-190 (1998) where signals of magnetizations made to follow two pathways through a protein are observed. The pulse sequence used is illustrated in FIGS. 9A to 9F. This method is a three-dimensional experiment performed to obtain chemical shifts of five nuclei $^1H_N$, $^{15}N$, $^{13}C_\alpha$, $^{13}CO$, and $^1H_\alpha$ of the backbone of a protein or peptide.

Figure 10:
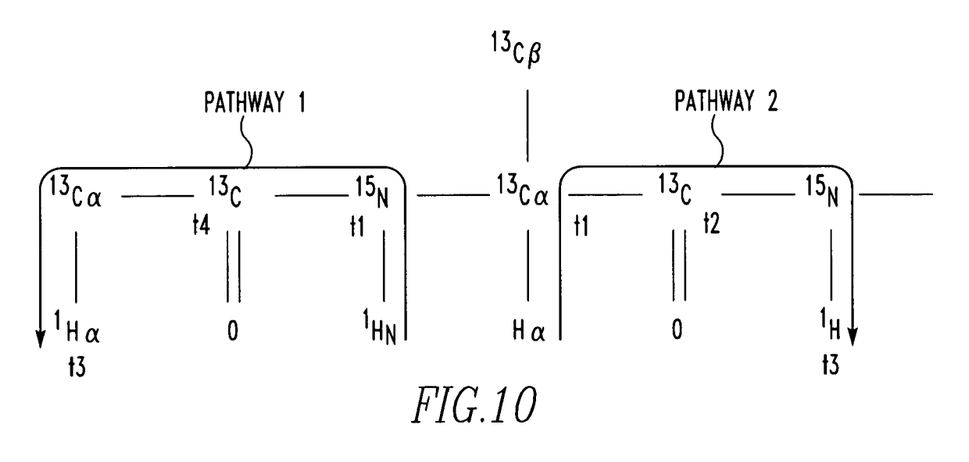
FIG. 10 is a diagram illustrating two magnetization transfer pathways through a protein structure formed by peptide coupling of two amino acid residues or through a peptide structure.

This experiment is so set up as to observe an NMR signal consisting of two magnetization transfer pathways in the backbone of a protein or peptide. FIG. 10 shows two magnetization transfer pathways through a protein or peptide structure formed by peptide coupling of two amino acid residues.

Pathway 1 for magnetization of excited $^1H_N$ consists of chemical shift evolution $(t_1)$ at $^{15}N$, chemical shift evolution $(t_2)$ at $^{13}CO$, transfer of the magnetization to $^{13}C_\alpha$, and observation $(t_3)$ at $^1H_\alpha$ as given below. A chemical shift evolution referred to herein is a phenomenon in which the sense of magnetization becomes nonuniform due to chemical shift (deviation in frequency from the rotational frequency of a rotating system of coordinates).

Pathway 1: $^1H_N \to {}^{15}N(t_1) \to {}^{13}CO(t_2) \to {}^{13}C_\alpha \to {}^1H_\alpha(t_3)$ Pathway 2 for magnetization of excited $H_\alpha$ consists of chemical shift evolution $(t_1)$ at $^{13}C_\alpha$, chemical shift evolution $(t_2)$ at $^{13}CO$, transfer of the magnetization to $^{15}N$, and observation $(t_3)$ at $^1H_N$ as given below.

Pathway 2: $^1H_\alpha \to {}^{13}C_\alpha(t_1) \to {}^{13}CO(t_2) \to {}^{15}N \to {}^1H_N(t_3)$ The problem with this experiment is that the pulse sequence is lengthened due to execution of plural chemical shift evolutions. Hence, the sensitivity is deteriorated by the effects of magnetization relaxation.

This problem is hereinafter described. In period $t_1$ of this experiment, the magnetization in the pathway 1 is oriented in the Z-direction to prevent chemical shift evolution. During this time interval, a chemical shift evolution $^{13}C(t_1)$ in the pathway 2 is carried out. Then, the magnetization in the pathway 2 is oriented in the Z-direction to prevent chemical shift evolution. During this time interval, a chemical shift evolution $^{15}N(t_1)$ in the pathway 1 is carried out. Since the chemical shift evolution during each $t_1$ and the chemical shift evolution during each $t_2$ are each made up of a long pulse sequence (such as tens of milliseconds), it takes a long time until a detection is started. The magnetization returns to a steady state with elapse of time. In this case, the magnetization oriented in the Z-direction is not time-modulated by chemical shifts but a spin-lattice relaxation of the magnetization occurs. Therefore, in practice, the efficiency is very low and the sensitivity is poor although the measurement is being performed. The signal sensitivity obtained finally decreases.

For this reason, where magnetizations are being observed generally in the same pathway using a pulse sequence, an NMR signal can be observed with better sensitivity if the pulse sequence is shortened because the effect of relaxation is reduced.

On the other hand, in multidimensional NMR spectroscopy, the pulse sequence can be shortened by the concatenation technique by simultaneously carrying out mutual transfer of in-phase magnetization and antiphase magnetization and chemical shift evolution. For example, during generally used chemical shift evolution of $^{15}N$ in a HNCO experiment, transfer of magnetization from antiphase magnetization of $^{15}N$ and $^{13}CO$ to in-phase magnetization of $^{15}N$ is effected while performing a chemical shift evolution of $^{15}N$. Thus, the pulse sequence is shortened. Furthermore, general multidimensional NMR methods with three-dimensionality or higher, such as the aforementioned HNCO experiment and CBCA (CO)NH experiment, the concatenation technique is effectively utilized. In each method, however, plural independent evolution periods are necessary. Consequently, a measurement is performed for a long time for evolution as each different axis for multidimensional measurement.

In the aforementioned experiment by Pang et al., magnetization is transferred in two directions simultaneously. In this experiment, the pulse sequence itself is lengthened. Therefore, the sensitivity loss due to relaxation is increased. Furthermore, in general multidimensional NMR spectroscopy with three-dimensionality or higher including the method of Pang et al., the measurement is composed of plural indirect chemical shift evolution periods and so there is the problem that a long duration measurement is necessary.

As described so far, the measurement method consists of generally using transfer of magnetization along one pathway. It is only possible to measure a signal arising from magnetization passed through the single pathway. In order to obtain information about plural pathways, it has been necessary to conduct a separate experiment for each pathway.

Furthermore, in the technique of simultaneously observing plural pathways using a special measurement method as described in the above-cited reference, chemical shift evolution of plural nuclei needs to be performed in separate evolution periods. Since the loss of sensitivity due to relaxation of nuclear magnetization is large, it has been rare that useful measurement results are obtained in practice.

Additionally, in order to obtain plural chemical shifts, they need to be measured as respective axes. Hence, a long duration measurement is required to perform such a multidimensional measurement. As a result, the measurement sensitivity-per-unit time has been low.

SUMMARY OF THE INVENTION

Accordingly, it is an object of an NMR measurement method according to the present invention to minimize sensitivity loss due to relaxation to thereby shorten the measurement time by observing plural magnetization transfer patterns in one experiment and observing simultaneously time modulations of their respective chemical shift evolutions.

The NMR measurement method which solves the foregoing problem in accordance with the present invention is a method of multidimensional NMR measurement and characterized in that in a case where there are plural magnetization transfer pathways from excitation of magnetization to observation, the pathways are time-modulated at the same time.

Magnetization follows a first magnetization transfer pathway in going from a first nucleus to a second nucleus. Magnetization follows a second magnetization transfer pathway in going from the second nucleus to the first nucleus. Preferably, the first and second pathways are time-modulated at the same time.

In one feature of the present invention, the first nucleus is peptide-coupled amide $^{15}N$ nucleus, while the second nucleus is peptide-coupled $^{13}C$ nucleus in the alpha position.

In another feature of the present invention, the transfer of magnetization is preferably caused by at least one of J-coupling and dipole-dipole interaction.

The present invention also provides an NMR pulse sequence which is used for NMR measurements and which has first, second, and third pulse sequences. With respect to magnetically coupled first and second nuclei, the first pulse sequence induces a transition from either in-phase magnetization of the first nucleus coupled to the second nucleus or in-phase magnetization of the second nucleus coupled to the first nucleus to either antiphase magnetization of the first nucleus coupled to the second nucleus or antiphase magnetization of the second nucleus coupled to the first nucleus. Subsequently to the first pulse sequence, the second pulse sequence exchanges either antiphase magnetization of the first nucleus coupled to the second nucleus or antiphase magnetization of the second nucleus coupled to the first nucleus for either antiphase magnetization of the second nucleus coupled to the first nucleus or antiphase magnetization of the first nucleus coupled to the second nucleus. Subsequently to the second pulse sequence, the third pulse sequence induces a transition from either antiphase magnetization of the second nucleus coupled to the first nucleus or antiphase magnetization of the first nucleus coupled to the second nucleus to either in-phase magnetization of the second nucleus coupled to the first nucleus or in-phase magnetization of the first nucleus coupled to the second nucleus. In each of the first and third pulse sequences, chemical shift evolution is performed for a given period.

In one feature of the NMR pulse sequence of the present invention, the first nucleus is peptide-coupled amide $^{15}N$ nucleus, while the second nucleus is a peptide-coupled $^{13}C$ nucleus in the alpha position.

In another feature of the NMR pulse sequence of the present invention, during measurement of peptide coupling, the first pulse sequence induces a transition from in-phase magnetization of $^{15}N$ to antiphase magnetization of $^{15}N^{13}C_\alpha$ and, at the same time, induces a transition from in-phase magnetization of $^{13}C_\alpha$ to antiphase magnetization of $^{13}C_\alpha{}^{15}N$, where $^{15}N$ is a peptide-coupled amide nitrogen nucleus and $^{13}C_\alpha$ is a peptide-coupled carbon nucleus in the alpha position.

In a further feature of the NMR pulse sequence of the present invention, during measurement of peptide coupling, the second pulse sequence induces a transition from antiphase magnetization of $^{15}N^{13}C_\alpha$ to antiphase magnetization of $^{13}C_\alpha{}^{15}N$ and, at the same time, induces a transition from antiphase magnetization of $^{13}C_\alpha{}^{15}N$ to antiphase magnetization of $^{15}N^{13}C_\alpha$, where $^{15}N$ is a peptide-coupled amide nitrogen nucleus and $^{13}C_\alpha$ is a peptide-coupled carbon nucleus in the alpha position.

In yet another feature of the NMR pulse sequence of the present invention, during measurement of peptide coupling, the third pulse sequence induces a transition from antiphase magnetization of $^{13}C_\alpha{}^{15}N$ to in-phase magnetization of $^{13}C_\alpha$ and, at the same time, induces a transition from antiphase magnetization of $^{15}N^{13}C_\alpha$ to in-phase magnetization of $^{15}N$, where $^{15}N$ is a peptide-coupled amide nitrogen nucleus and $^{13}C_\alpha$ is a peptide-coupled carbon nucleus in the alpha position.

The NMR measurement method according to the present invention can suppress sensitivity loss due to magnetization relaxation to a minimum by time-modulating plural magnetizations at the same time. Furthermore, the measurement time can be shortened.

The NMR pulse sequence according to the present invention is used in the NMR measurement method and can suppress sensitivity loss due to magnetization relaxation to a minimum by time-modulating plural magnetizations at the same time. Also, the NMR pulse sequence can shorten the measurement time.

Other objects and features of the invention will appear in the course of the description thereof, which follows.

DESCRIPTION OF THE PREFERRED EMBODIMENTS

Figure 1:
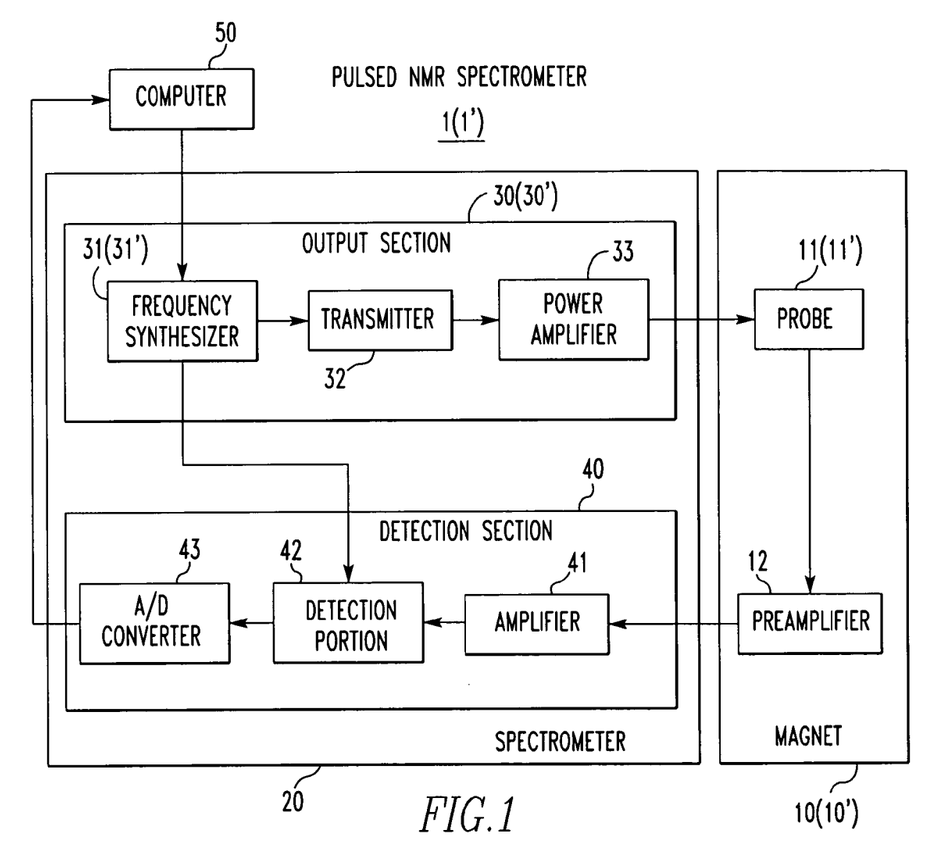
FIG. 1 is a block diagram of a pulsed NMR spectrometer with a multichannel configuration.

The preferred embodiments of the present invention are hereinafter described. FIG. 1 is a block diagram of a pulsed NMR spectrometer 1 with a multichannel configuration.

The pulsed NMR spectrometer 1 analyzes the structure of a protein or peptide. In particular, information about chemical shifts or spin-spin coupling is obtained as structural information for determining the structure of the protein or peptide by performing four experiments which are described below as Examples 1-4.

Example 1 is an experiment in which the correlations of compounds labeled with stable isotope $^{13}$C or $^{15}$N are found. Example 2 is an experiment in which the correlations of amide proton ($^{1}H_N$), amide nitrogen ($^{15}$N), alpha carbon ($^{13}C_\alpha$), and alpha proton ($^{1}H_\alpha$) in a protein or peptide labeled with stable isotope $^{13}$C or $^{15}$N are found. Example 3 is an experiment in which the correlations are found using residual dipolar coupling between $^{13}$C and $^{15}$N in a compound labeled with stable isotope $^{13}$C or $^{15}$N. Example 4 is an experiment in which the correlations are found using the residual dipolar coupling between amide nitrogen ($^{15}$N) and alpha carbon ($^{13}C_\alpha$) in a protein or peptide labeled with stable isotope with $^{13}$C or $^{15}$N.

Embodiment 1

When used in an experiment for finding the correlations in a sample or compound labeled with stable isotope $^{13}$C or $^{15}$N, the pulsed NMR spectrometer 1 produces a measuring magnetic field that is set, for example, to 14.1 T (600 MHz when converted into a proton resonance frequency). The spectrometer 1 is designed to be composed of a superconducting magnet 10, a spectrometer 20, and a computer 50, as shown in FIG. 1.

The spectrometer 20 of the pulsed NMR spectrometer 1 has an output section 30 for simultaneously producing two or more frequencies to the magnet 10 and a detection section 40 for digitally detecting the phase of the output signal from the probe 11 (described later) of the magnet 10.

The output section 30 has a frequency synthesizer 31 for emitting two or more frequencies simultaneously, a transmitter 32 for wave-shaping the output from the frequency synthesizer 31 and controlling the produced pulses, and a power amplifier 33 for power-amplifying the output from the transmitter. The frequencies emitted by the synthesizer 31 cover 150.8 MHz of $^{13}$C and 60.8 MHz of $^{15}$N.

The detection section 40 has an amplifier 41 for amplifying the output signal from the probe, a detection portion 42 for phase-detecting the output signal from the amplifier 41, and an A/D converter 43 for converting the output signal from the detection portion 42 into digital form.

The magnet 10 consists of a superconducting coil made of NbTi and Nb$_3$Sn, for example. Mounted inside the magnet are the aforementioned probe 11 acting as a send-receive coil for detecting a feeble signal from the sample and sending pulsed electromagnetic waves to the sample and a preamplifier 12 for preamplifying the output signal from the probe 11 and supplying the signal to the detection section 40. In particular, the probe 11 detects signals of $^{13}$C (150.8 MHz) and $^{15}$N (60.8 MHz).

The computer 50 has a central processing unit (CPU), a ROM, a RAM, a HDD, and an I/O interface connected with the CPU by an internal bus. The computer 50 is connected with the output section 30 and detection section 40 of the spectrometer 20 via a communication interface to control the frequency of the frequency synthesizer 31 and process the phase-sensitively detected digital data from the A/D converter 43.

A method of NMR measurement according to the present embodiment is implemented as an NMR measurement program by the computer 50. The program is stored, for example, in the ROM or HDD, and read into the RAM by the CPU. The program is executed using the RAM as a working area.

Where there are plural magnetization transfer pathways from excitation of magnetization to observation, this method of NMR measurement time-modulates these pathways at the same time. Since the pathways are time-modulated simultaneously, sensitivity loss due to magnetization relaxation can be reduced to a minimum. Furthermore, the measuring time can be shortened.

The operation of Embodiment 1 is hereinafter described. In this Embodiment 1, the NMR spectrometer 1 executes the NMR measurement program based on the above-described NMR measurement method.

When the magnetization of nucleus A and the magnetization of nucleus B are J-coupled, modulation caused by the J-coupling changes either in-phase magnetization of the nucleus A or in-phase magnetization of the nucleus B into either antiphase magnetization of the nucleus A coupled to the nucleus B or antiphase magnetization of the nucleus B coupled to the nucleus A.

The antiphase magnetization of the nucleus A coupled to the nucleus B and the antiphase magnetization of the nucleus B coupled to the nucleus A can be interchanged by applying a 90° pulse to each of the nuclei A and B simultaneously.

Furthermore, in-phase magnetization of the nucleus B or in-phase magnetization of the nucleus A can be obtained by modulating the interchanged magnetizations making use of J-coupling from antiphase magnetization to in-phase magnetization. Consequently, the magnetizations of the nuclei A and B can be interchanged.

Figure 2:
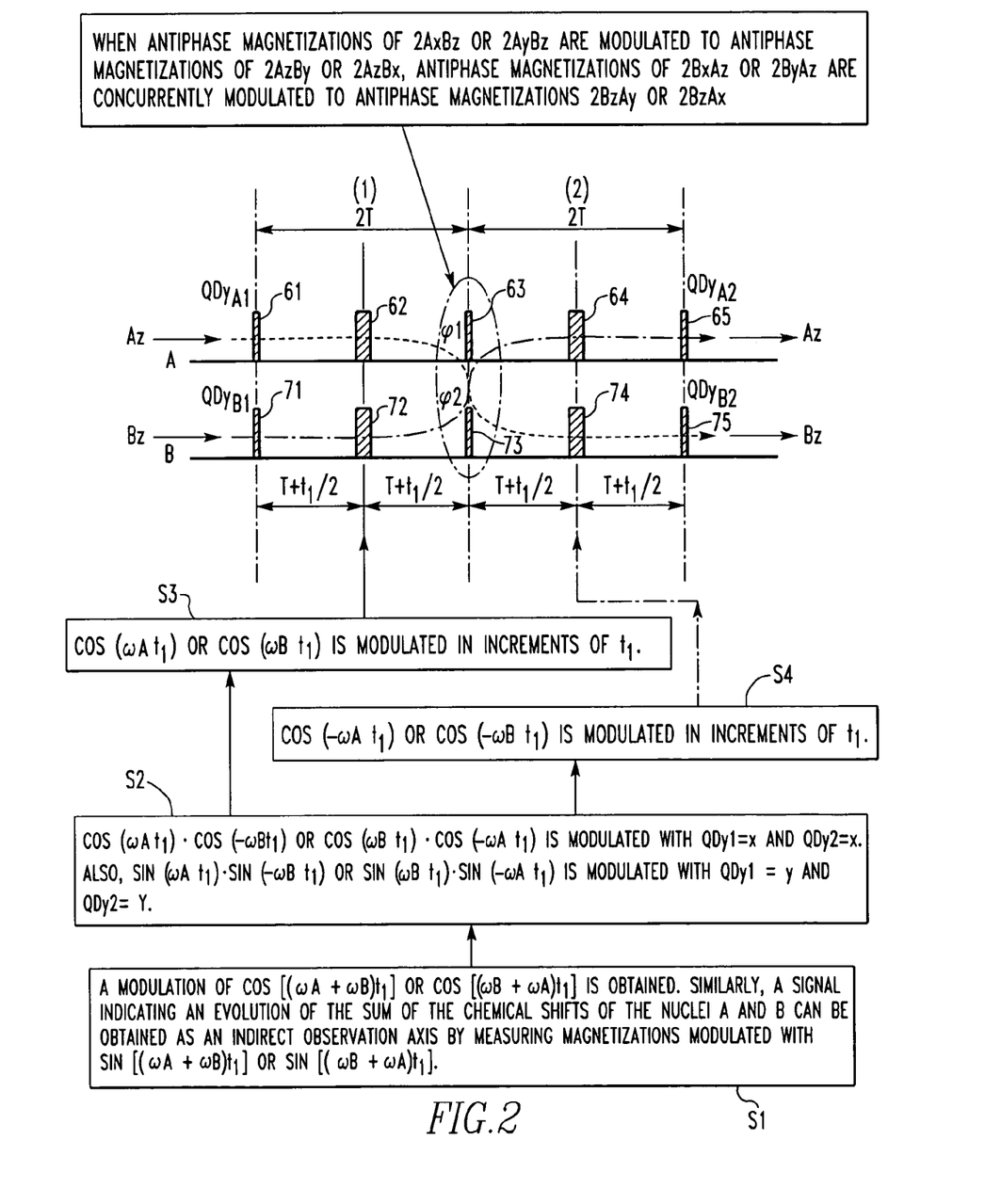
FIG. 2 is a diagram illustrating the basic portion of a pulse sequence for performing exchange of magnetizations between nuclei A and B and chemical shift evolution at the same time.

FIG. 2 illustrates the basic portion of a pulse sequence for carrying out the interchange of the magnetizations of the nuclei A and B and chemical shift evolution at the same time. The horizontal axis indicates time. Portions A and B of the diagram indicate the timings at which RF pulses 61-65 and 71-75 of the frequencies of the nuclei A and B are emitted. Each 90° pulse is indicated by a thin vertical line. Each 180° pulse is indicated by a bold vertical line. It is assumed that each RF pulse whose phase is not explained has a phase of x.

Specifically, with respect to the magnetization of $A_z$, the RF pulse 61 is a 90° pulse having a phase of $QD_{yA1}$. The RF pulse 62 is a 180° pulse having a phase of x. The RF pulse 63 is a 90° pulse having a phase of $\phi_1$. The RF pulse 64 is a 180° pulse having a phase of x. The RF pulse 65 is a 90° pulse having a phase of $QD_{yA2}$.

With respect to the magnetization of $B_z$, the RF pulse 71 is a 90° pulse having a phase of $QD_{yB1}$. The RF pulse 72 is a 180° pulse having a phase of x. The RF pulse 73 is a 90° pulse having a phase of $\phi_2$. The RF pulse 74 is a 180° pulse having a phase of x. The RF pulse 75 is a 90° pulse having a phase of $QD_{yB2}$.

The phase cycles of the RF pulses 61, 63, 65, 71, 73, and 75 are as follows:

$\phi_1 = \{x, -x, -x, x\}$ $\phi_2 = \{x, x, -x, -x\}$ $QD_{yA1}^* = \{4(x), 4(y)\}, \{4(x), 4(y)\}$ $QD_{yB1}^* = \{4(-x), 4(-y)\}, \{4(x), 4(-y)\}$ $QD_{yA2} = \{4(x), 4(-y)\}, \{4(-y), 4(x)\}$ $QD_{yB2} = \{4(x), 4(-y)\}, \{4(-y), 4(x)\}$ $\phi_{acq}^* = \{x, -x\}$.

For example, $\phi_1 = \{x, -x, -x, x\}$ means that when accumulation is performed (4×n) times, RF pulses are applied according to a repetition sequence in which one cycle of the phase $\phi_1$ is made up of +x, −x, −x, +x during each accumulation. The same principle applies to $\phi_2$. $QD_{yA1}*=\{4(x), 4(y)\}, \{4(x), 4(y)\}$ means that the phase of the real part is cycled through eight steps: x, x, x, x, y, y, y, y and that the phase of the imaginary part is cycled through eight steps: x, x, x, x, y, y, y, y in one cycle. The technique used in RF pulse irradiation is referred to as phase cycling. Notation * means that the phase of each RF pulse is inverted 180° at each slice. The indirect observation axis is evolved by the States-TPPI method.

Desired transfer of magnetizations and chemical shift evolution can be simultaneously carried out by appropriately inserting this pulse sequence into other pulse sequences.

The basic portion of the pulse sequence is composed of a former half portion (1), a latter half portion (2), and an intervening portion. In the former half portion (1), in-phase magnetizations of $A_x$ or $A_y$ and $B_x$ or $B_y$ are caused to make a transition to antiphase magnetizations of $2A_yB_z$ or $2A_xB_z$ and $2B_yA_z$ or $2B_xA_z$. 90° RF pulses 63 and 73 in the subsequent intermediate portion between (1) and (2) exchange the antiphase magnetizations ($2A_yB_z$ or $2A_xB_z \rightarrow 2A_zB_y$ or $2A_zB_x$ and $2B_yA_z$ or $2B_xA_z \rightarrow 2B_zA_y$ or $2B_zA_x$). In the latter half portion (2), using the RF pulses 64, 65, 74, and 75, a transition is made from antiphase magnetizations of $2A_zB_y$ or $2A_zB_x$ and $2B_zA_y$ or $2B_zA_x$ to in-phase magnetizations $B_x$ or $B_y$ and $A_x$ or $A_y$.

In FIG. 2, simultaneously with the exchange of the nuclear magnetizations, a chemical shift evolution is performed by a constant-time evolution technique. This is enabled because the magnetizations of the nuclei A and B are in the lateral magnetization state in the former half portion (1) and latter half portion (2).

Accordingly, by performing a measurement using this pulse sequence, chemical shift evolution can be performed simultaneously with transfer of two magnetization pathways.

Furthermore, in this experiment, the phases of the RF pulses are varied during two accumulation processes. Consequently, chemical shift evolutions in the former half portion (1) and latter half portion (2) are detected in quadrature as signals of evolutions of sums of chemical shifts. The observed interferogram of the real part is given by:

cos modulation(chemical shift of nucleus A or B) of (1) ×
    cos modulation(chemical shift of nucleus B or A) of (2) −
    sin modulation(chemical shift of nucleus A or B) of (1) ×
        sin modulation(chemical shift of nucleus B or A) of (2).

The observed interferogram of the imaginary part is given by:

cos modulation(chemical shift of nucleus A or B) of (1) ×
    sin modulation(chemical shift of nucleus B or A) of (2) +
    sin modulation(chemical shift of nucleus A or B) of (1) ×
        cos modulation(chemical shift of nucleus B or A) of (2).

As a result, cos modulation (chemical shift of nucleus A+chemical shift of nucleus B) of (1)+(2) and sin modulation (chemical shift of nucleus A+chemical shift of nucleus B) of (1)+(2) are obtained.

In this experiment, a differential modulation between the chemical shift of the nucleus A and the chemical shift of the nucleus B can be obtained by inverting the phases at the second accumulation. It is also possible to obtain two sets of information about the sum and difference between the chemical shifts of the nuclei A and B simultaneously by observing data about two accumulations separately and performing addition and subtraction during processing.

The processing procedure described so far is illustrated as steps S1-S4 in FIG. 2. In particular, in step S1, a modulation of $\cos[(\omega_A+\omega_B)t_1]$ or $\cos[(\omega_B+\omega_A)t_1]$ is obtained. Similarly, a signal indicating an evolution of the sum of the chemical shifts of the nuclei A and B can be obtained as an indirect observation axis by measuring magnetizations modulated with $\sin[(\omega_A+\omega_B)t_1]$ or $\sin[(\omega_B+\omega_A)t_1]$.

In step S2, $\cos(\omega_A t_1) \cdot \cos(-\omega_B t_1)$ or $\cos(\omega_B t_1) \cdot \cos(-\omega_A t_1)$ is modulated with $QD_{y1}=x$ and $QD_{y2}=x$. Also, $\sin(\omega_A t_1) \cdot \sin(-\omega_B t_1)$ or $\sin(\omega_B t_1) \cdot \sin(\omega_A t_1)$ is modulated with $QD_{y1}=y$ and $QD_{y2}=-y$.

In step S3, $\cos(\omega_A t_1)$ or $\cos(\omega_B t_1)$ is modulated in increments of $t_1$. In step S4, $\cos(-\omega_A t_1)$ or $\cos(-\omega_B t_1)$ is modulated in increments of $t_1$.

In the pulse sequence of FIG. 2, to facilitate discriminating between the peaks passed through the two pathways, the phase of the $QD_1$ is reversed between the nuclei A and B such that when one is observed as a positive peak, the other is observed as a negative peak.

In the case of an investigated sample labeled with stable isotope $^{13}C$ or $^{15}N$ in Embodiment 1, a state of J-coupling can be created between nucleus $^{13}C$ and nucleus $^{15}N$.

Figure 3:
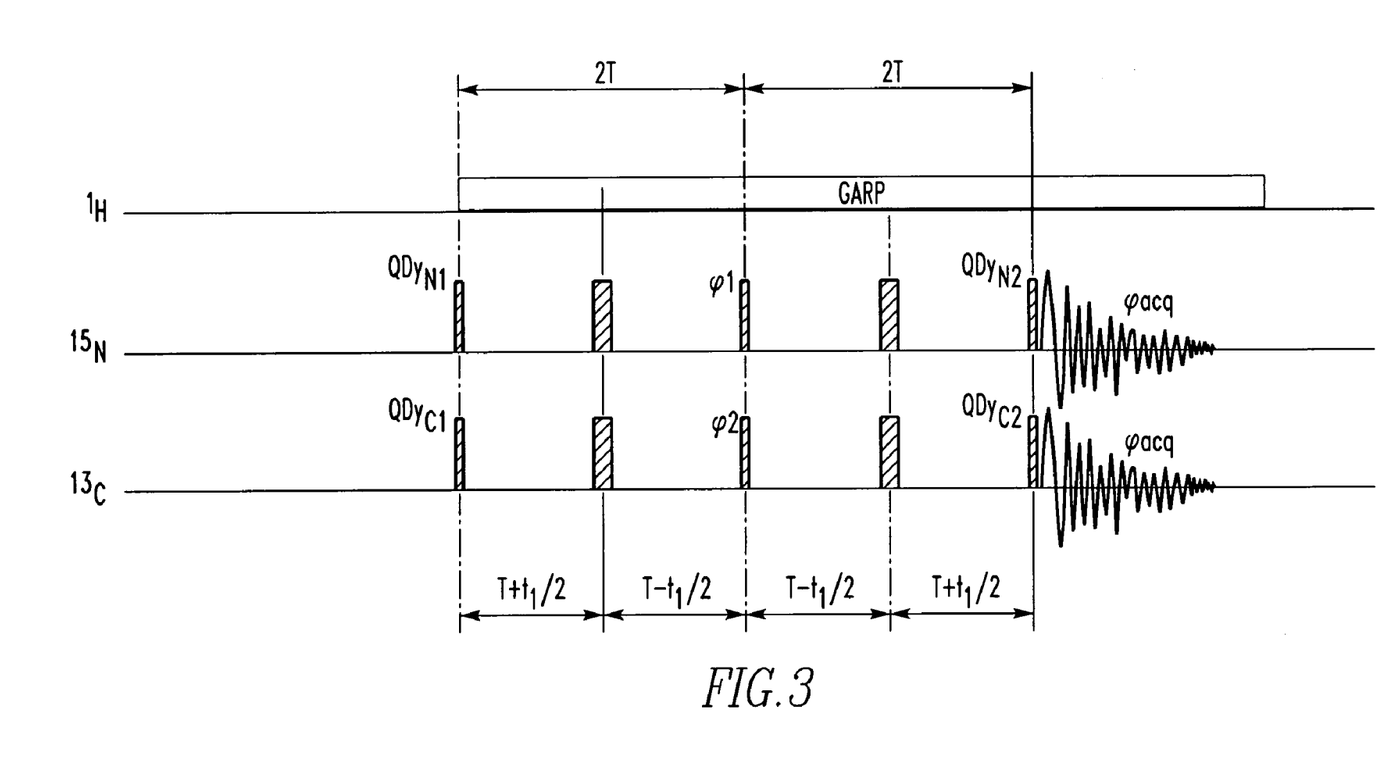
FIG. 3 is a diagram illustrating a pulse sequence using the technique illustrated in FIG. 2 when applied to measurement of a sample labeled with a stable isotope $^{13}C$ or $^{15}N$.

FIG. 3 illustrates a pulse sequence utilizing the technique of FIG. 2 in measuring a sample labeled with stable isotope $^{13}C$ or $^{15}N$. The horizontal axis indicates time. Each 90° pulse is indicated by a thin vertical line. Each 180° pulse is indicated by a bold vertical line. It is assumed that each RF pulse whose phase is not explained has a phase of x. Assume T=13.8 ms. The phase cycles of the RF pulses are as follows:

$\phi_1\{x,-x,-x,x\}$ $\phi_2=\{x,x,-x,-x\}$ $QD_{yN1}*=\{4(x),4(y)\},\{4(x),4(y)\}$ $QD_{yC1}*=\{4(-x),4(-y)\},\{4(-x),4(y)\}$ $QD_{yN2}=\{4(x),4(-y)\},\{4(-y),4(x)\}$ $QDyC2=\{4(x),4(-y)\},\{4(-y),4(x)\}$ $\phi_{acq}*=\{2(x,-x),2(-x,x)\}$.

Notation * means that the phase of each RF pulse is inverted 180° at each slice of the indirect observation axis according to the States-TPPI method. In the figure, GARP indicates a decoupling technique. The indirect observation axis is evolved by the States-TPPI method.

With this pulse sequence, magnetizations are transferred in the route $^{15}N \rightarrow ^{13}C$ and, at the same time, information is obtained under the condition where the indirect observation axis is evolved with the sum of chemical shift of nucleus $^{15}N$ and chemical shift of nucleus $^{13}C$. Concurrently, information can be obtained under the condition where the indirect observation axis is evolved as the sum of chemical shift of nucleus $^{15}N$ and chemical shift of nucleus $^{13}C$ while inducing transfer of magnetizations in the route $^{13}C \rightarrow ^{15}N$.

In measurements using the pulse sequence of FIG. 3, the sum of chemical shift of nucleus $^{15}N$ and chemical shift of nucleus $^{13}C$ can be observed as an indirect observation axis. The chemical shift of $^{15}N$ or $^{13}C$ can be observed as a direct observation axis. Furthermore, evolution of chemical shifts and transfer of magnetizations are carried out simultaneously by a concatenation technique. Consequently, loss of magnetization due to relaxation is small. In this case of Embodiment 1, information obtained from the indirect observation axis is not different between the route $^{15}N\rightarrow^{13}C$ and the route $^{13}C\rightarrow^{15}N$. Where other transfer of magnetization is performed before or after the pulse sequence block of FIG. 2, it can be identified that magnetization having different chemical shift information in the observation period is a magnetization transferred from the same $^{13}C-^{15}N$ bond, by referring to the information about the indirect observation axis.

In consequence, different magnetizations can be precisely interrelated by inserting the pulse sequence block of FIG. 3 into an appropriate measurement. That is, in the pulsed NMR spectrometer 1 shown in FIG. 1, the computer 50 controls the output section 30 and thus the basic portion of the pulse sequence shown in FIG. 2 (i.e., a pulse sequence as shown in FIG. 3) is produced from the frequency synthesizer 31 and transmitter 32 and desired transfer of magnetizations and chemical shift evolution can be performed simultaneously. Different magnetizations can be interrelated precisely.

Embodiment 2

Figure 4:
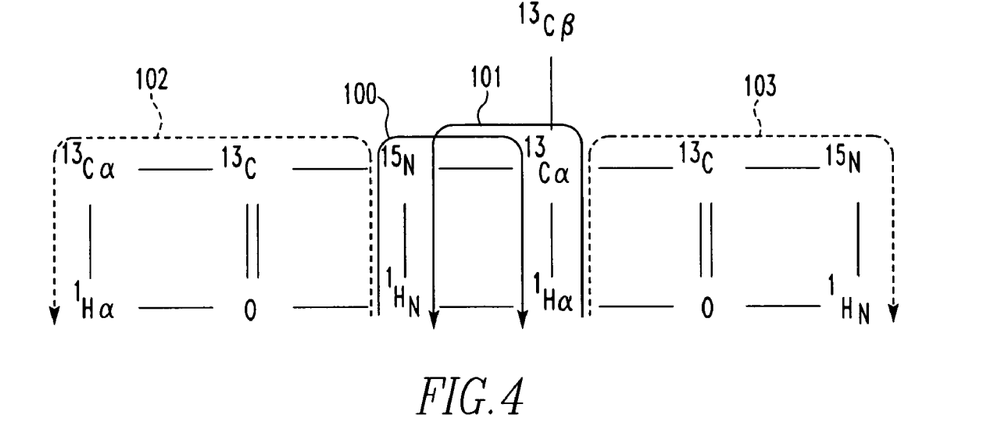
FIG. 4 is a diagram illustrating two magnetization transfer pathways through a protein structure formed by peptide coupling of two amino acid residues.

Embodiment 2 is a specific example of implementation of an experiment for observing signals of magnetizations transferred along two pathways through a protein or peptide, using the pulsed NMR measuring method employing a pulsed NMR spectrometer 1'. FIG. 4 shows two magnetization transfer pathways through a protein or peptide structure formed by peptide coupling of two amino acid residues.

Especially, Embodiment 2 is an experiment for finding the correlations among amide proton ($^1H_N$), amide nitrogen ($^{15}N$), alpha carbon ($^{13}C_\alpha$), and alpha proton ($^1H_\alpha$) indicated by the arrows 100 in FIG. 4 in a protein or peptide labeled with stable isotope $^{13}C$ or $^{15}N$.

The pulsed NMR spectrometer 1' produces a measuring magnetic field set, for example, to 14.1 T (600 MHz when converted into a proton resonance frequency). The pulsed NMR spectrometer 1' used in this Embodiment 2 is similar in configuration to the pulsed NMR spectrometer 1 shown in FIG. 1 except for the capabilities of frequency synthesizer 31' of output section 30' and probe 11' inside a magnet 10'.

The output section 30' emits three or more frequencies which cover 600.0 MHz of $^1H$, 150.8 MHz of $^{13}C$, and 60.8 MHz of $^{15}N$.

The probe 11' detects a signal of $^1H$ (600.0 MHz) and a frequency lock signal of $^2H$ (92.1 MHz). An example of the investigated sample is a protein labeled with stable isotope $^{13}C$ or $^{15}N$ as described previously.

In the case of amino acid residue within a protein or peptide labeled with stable isotope $^{13}C$ or $^{15}N$ of Embodiment 2 as shown in FIG. 4, such a J-coupled state can be created between $^{13}C_\alpha$ nucleus and $^{15}N$ nucleus in the same way as in Embodiment 1.

Figure 5:
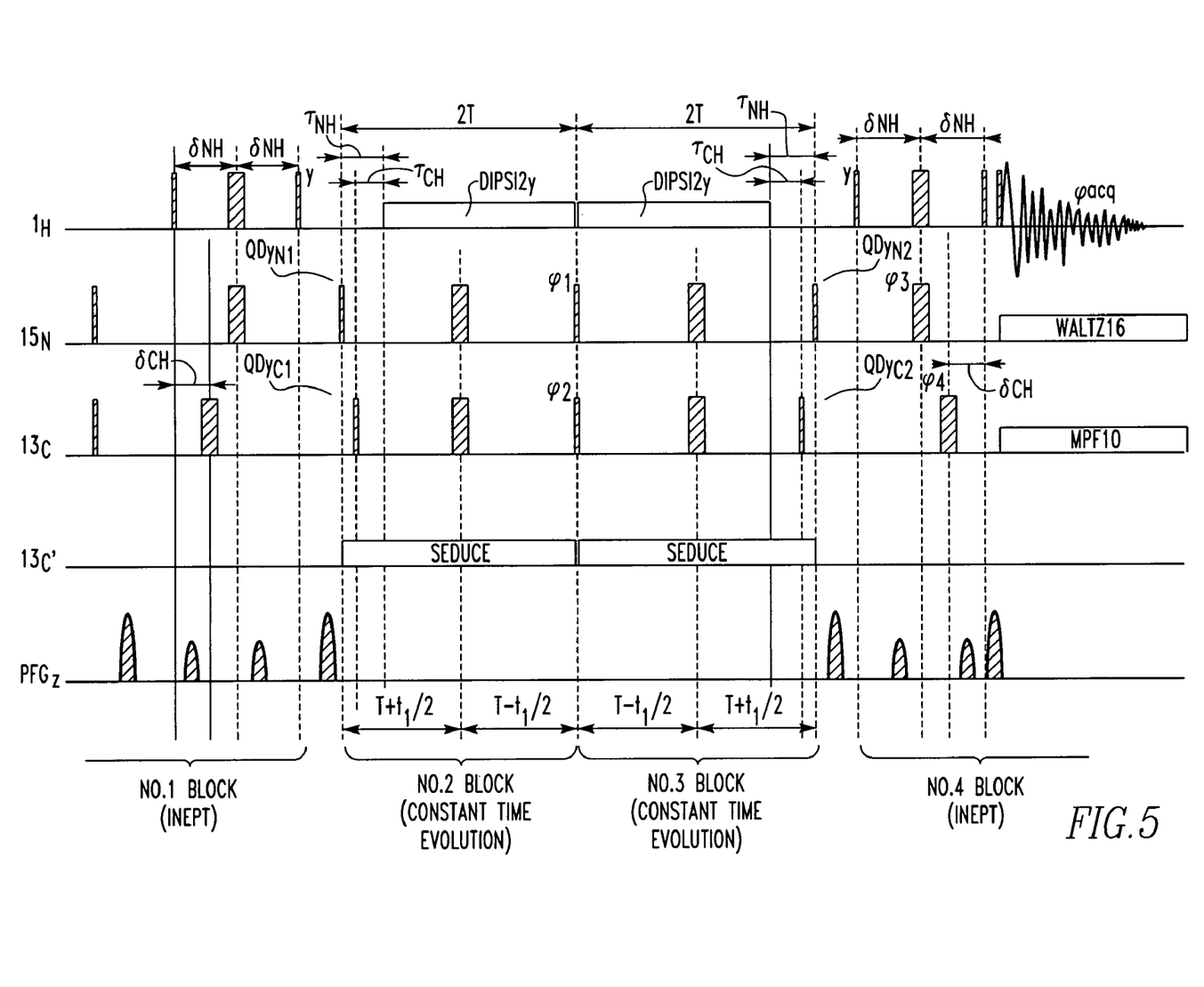
FIG. 5 is a diagram illustrating a pulse sequence using the technique of FIG. 2 when applied to measurements of proteins and peptides.

FIG. 5 illustrates a pulse sequence which utilizes the technique illustrated in FIG. 2 in measuring a protein or peptide. The horizontal axis indicates time. Each 90° pulse is indicated by a thin vertical line. Each 180° pulse is indicated by a bold vertical line. It is assumed that each RF pulse whose phase is not explained has a phase of x. The phase cycles of the RF pulses are as follows:

$\phi_1\{x,-x,-x,x\}$ $\phi_2=\{x,x,-x,-x\}$ $\phi_3=\{4(x),4(y)\}$ $\phi_4=\{4(x),4(y)\}$ $QD_{yN1}*=\{4(x),4(y)\},\{4(x),4(y)\}$ $QD_{yC1}*=\{4(-x),4(-y)\},\{4(-x),4(y)\}$ $QDyN2=\{4(x),4(-y)\},\{4(-y),4(x)\}$ $QDyC2=\{4(x),4(-y)\},\{4(-y),4(x)\}$ $\phi acq*=\{x,-x\}-y\text{step}(180\% 2)$.

Notation * means that the phase of each RF pulse is inverted 180° at each slice of the indirect observation axis according to the States-TPPI method. In the figure, GARP indicates a decoupling technique. The indirect observation axis is evolved by the States-TPPI method.

The lengths of delays are as follows: $\delta_{NH}$=2.25 ms, $\delta_{CH}$=1.7 ms, T=13.8 ms, $\tau_{NH}$=5.4 ms, and $\tau_{CH}$=3.5 ms.

As shown in FIG. 5, the whole of this pulse sequence consists of four blocks: from NO. 1 to NO. 4. The NO. 2 and NO. 3 blocks are constant-time evolution portions, which correspond to the pulse sequence already described in connection with FIG. 2.

With this pulse sequence, magnetization transfer is induced with the route indicated by the arrows 100 in FIG. 4, i.e., $^1H_N$ (amide proton)$\rightarrow^{15}N$ (amide nitrogen)$\rightarrow^{13}C_\alpha$ (alpha carbon)$\rightarrow^1H_\alpha$ (alpha proton). At the same time, information about evolution of the sum of chemical shift of $^{15}N$ and chemical shift of $^{13}C$ can be obtained as an indirect observation axis. That is, carbonyl carbon ($^{13}CO$) is not excited.

Furthermore, in measurements using the pulse sequence of FIG. 5, signals of magnetizations shifted in the route as indicated by the arrows 101 in FIG. 4 (i.e., $^1H_\alpha\rightarrow^{13}C_\alpha\rightarrow^{15}N\rightarrow^1H_N$) can be observed as negative peaks. Signals of magnetizations passed through two pathways within the same measuring period are simultaneously obtained.

That is, during measurements using the pulse sequence of FIG. 5, the sum of chemical shift of $^{15}N$ and chemical shift of $^{13}C_\alpha$ can be observed as an indirect observation axis. A chemical shift of $^1H_N$ or $^1H_\alpha$ can be observed as a direct observation axis. Information about all chemical shifts of nuclei forming the backbone of a protein or peptide labeled with $^{13}C$ or $^{15}N$ except for carbonyl carbon ($^{13}CO$) can be obtained. In this example, loss of magnetization due to relaxation is reduced by a concatenation technique in the same way as in Embodiment 1. In addition, in the same way as in Embodiment 1, two sets of information, respectively, about the sum and difference between chemical shifts of $^{15}N$ and $^{13}C_\alpha$ can be obtained at the same time by making measurements of two sets of data using different phase cycling schemes during accumulation and subsequently performing addition and subtraction.

In actual measurements of protein or peptide labeled with $^{13}C$ or $^{15}N$, conditions under which magnetization is transferred between $^{15}N$ and $^{13}C_\alpha$ through an amino acid residue are very similar to conditions under which magnetization is transferred between $^{15}N$ and $^{13}C_\alpha$ across amino acid residues. Consequently, a peak corresponding to a magnetization residing within one residue and a peak corresponding to a magnetization residing between residues are both observed on the spectrum obtained by this measurement. Sequential chemical shift assignments of backbone peaks excluding carbonyl carbon peaks are possible only with two-dimensional measurements.

A specific example is shown below. Transfer of magnetization starts from $^1H_N$ of the ith amino acid residue in a protein or peptide. Transfer of magnetization in the route indicated by the arrows 100 in FIG. 4 (i.e., $^1H_{Ni} \rightarrow {}^{15}N_i \rightarrow {}^{13}C_{\alpha i} \rightarrow {}^1H_{\alpha i}$) occurs. Also, transfer of magnetization in the route indicated by the arrows 102 (i.e., $^1H_{Ni} \rightarrow {}^{15}N_i \rightarrow {}^{13}C_{\alpha i-1} \rightarrow {}^1H_{\alpha i-1}$) occurs. As a result, a peak of ($^1H_{\alpha i}$, $^{15}N_i + {}^{13}C_{\alpha i}$) and a peak of ($^1H_{\alpha i-1}$, $^{15}N_i + {}^{13}C_{\alpha i-1}$) are observed.

Furthermore, transfer of magnetization starts from $^1H_\alpha$ of the i-th amino acid residue. Transfer of magnetization occurs in the route indicated by the arrows 101 (i.e., $^1H_{\alpha i} \rightarrow {}^{13}C_{\alpha i} \rightarrow {}^{15}N_i \rightarrow {}^1H_{Ni}$). Also, transfer of magnetization in the route indicated by the arrows 103 (i.e., $^1H_{\alpha i} \rightarrow {}^{13}C_{\alpha i} \rightarrow {}^{15}N_{i+1} \rightarrow {}^1N_{i+1}$) occurs. As a result, a peak of ($^1H_{\alpha i}$, $^{15}N_i + {}^{13}C_{\alpha i}$) and a peak of ($^1H_{\alpha i+1}$, $^{15}N_{i+1} + {}^{13}C_{\alpha i}$) are observed.

Figure 6:
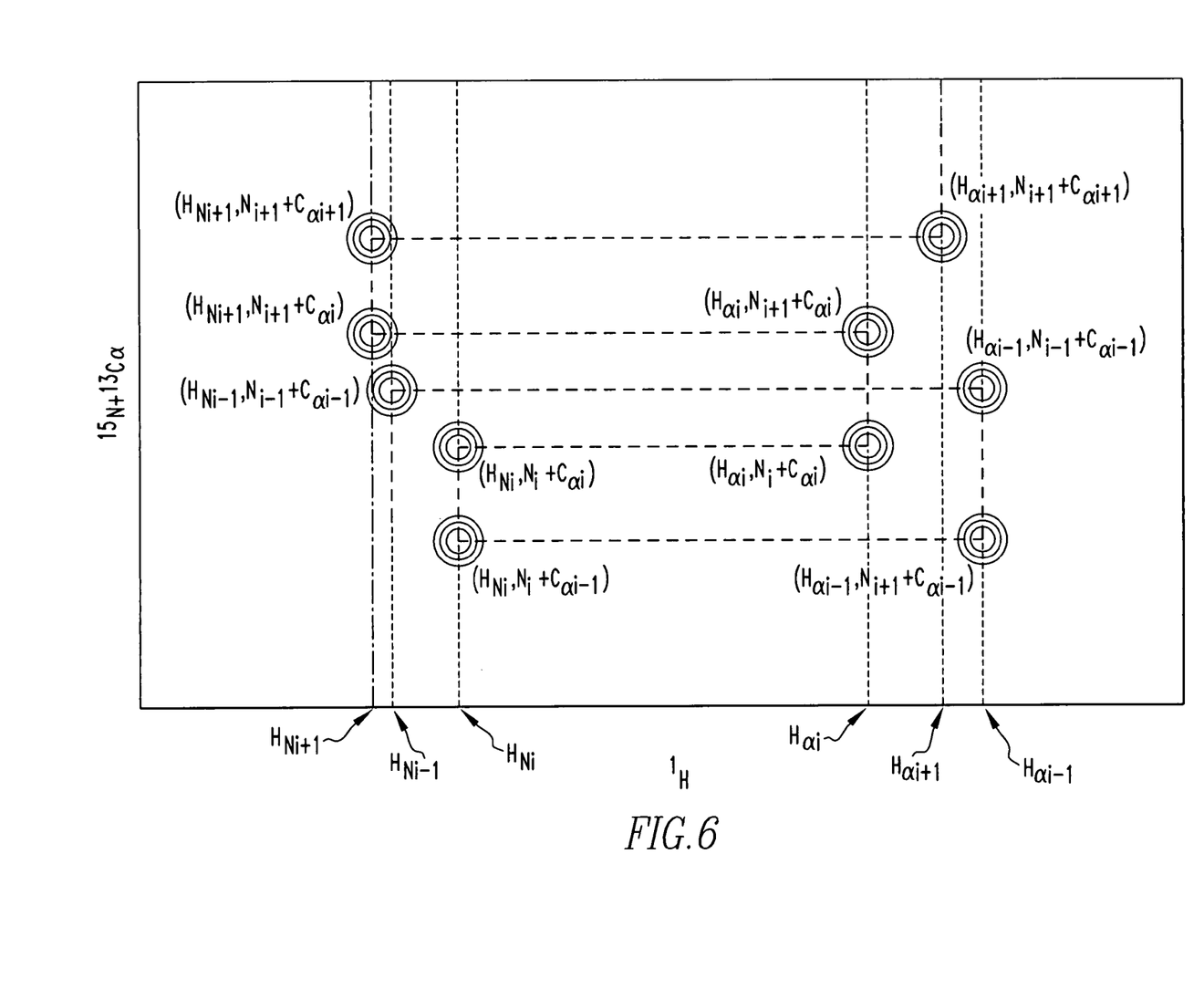
FIG. 6 is a diagram showing an example of peak pattern observed with the pulse sequence shown in FIG. 5.

In this case, peaks as shown in FIG. 6 are observed. Backbone assignments of a protein or peptide labeled with $^{13}C$ or $^{15}N$ excluding carbonyl carbon are possible only with two-dimensional measurements.

Actually observed peaks are as shown in FIG. 6. $^1H_{\alpha 1}$ is observed as a direct observation axis. In contrast, peaks are observed at the positions of the indirect observation axes of $^{15}N_i + {}^{13}C_{\alpha i}$ and $^{15}N_i + {}^{13}C_{\alpha i-1}$. At the same time, $^1H_{\alpha i}$ is observed as a direct observation axis. In contrast, peaks are observed at the positions of the indirect observation axes of $^{15}N_i + {}^{13}C_{\alpha i}$ and $^{15}N_{i+1} + {}^{13}C_{\alpha i}$. Accordingly, sequential chemical shift assignments of nuclei within the backbone excluding carbonyl carbon are enabled by connecting the peaks.

Figure 7:
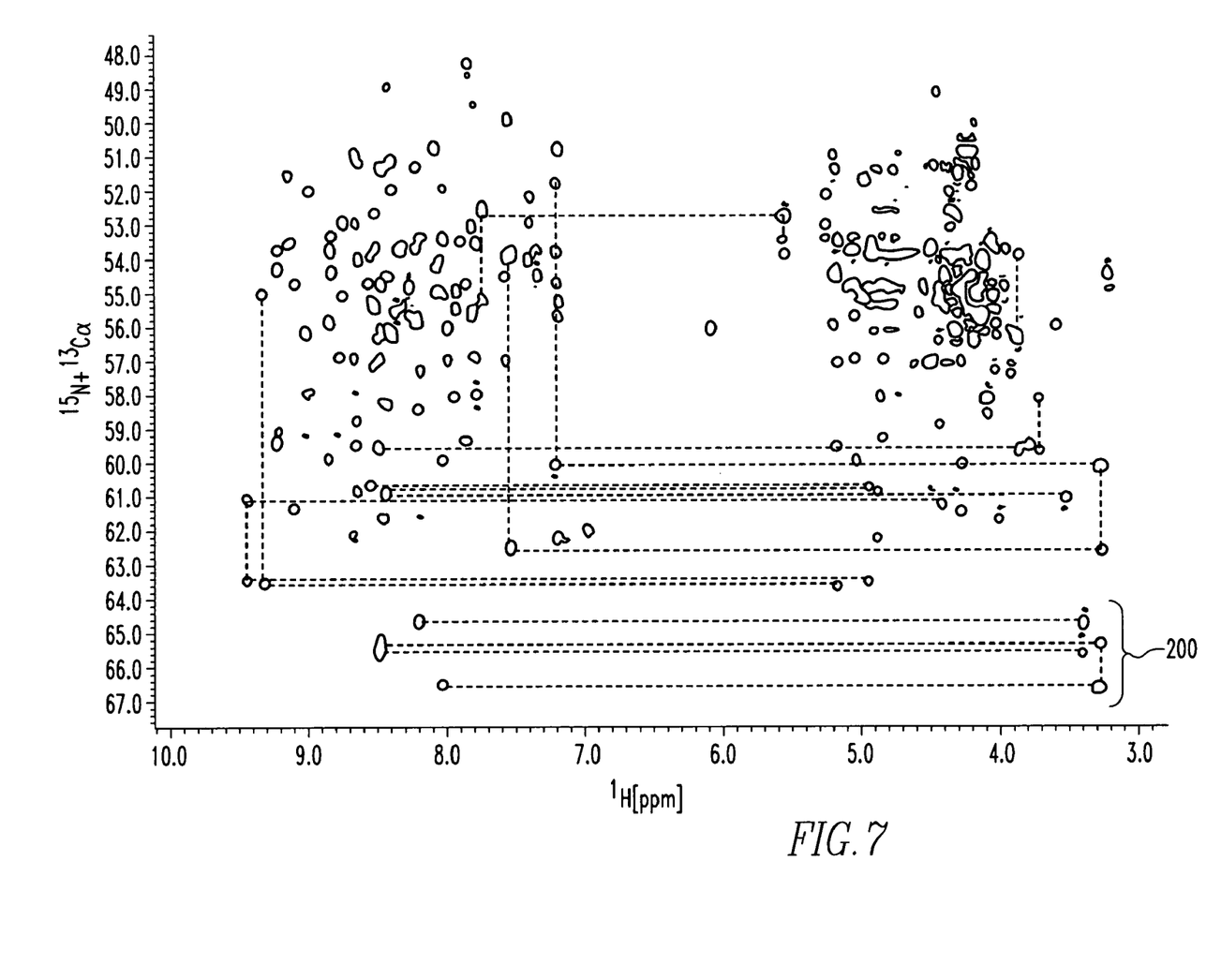
FIG. 7 is a diagram illustrating results of a measurement of chlorella ubiquitin by a measuring method according to the present invention.
Figure 8:
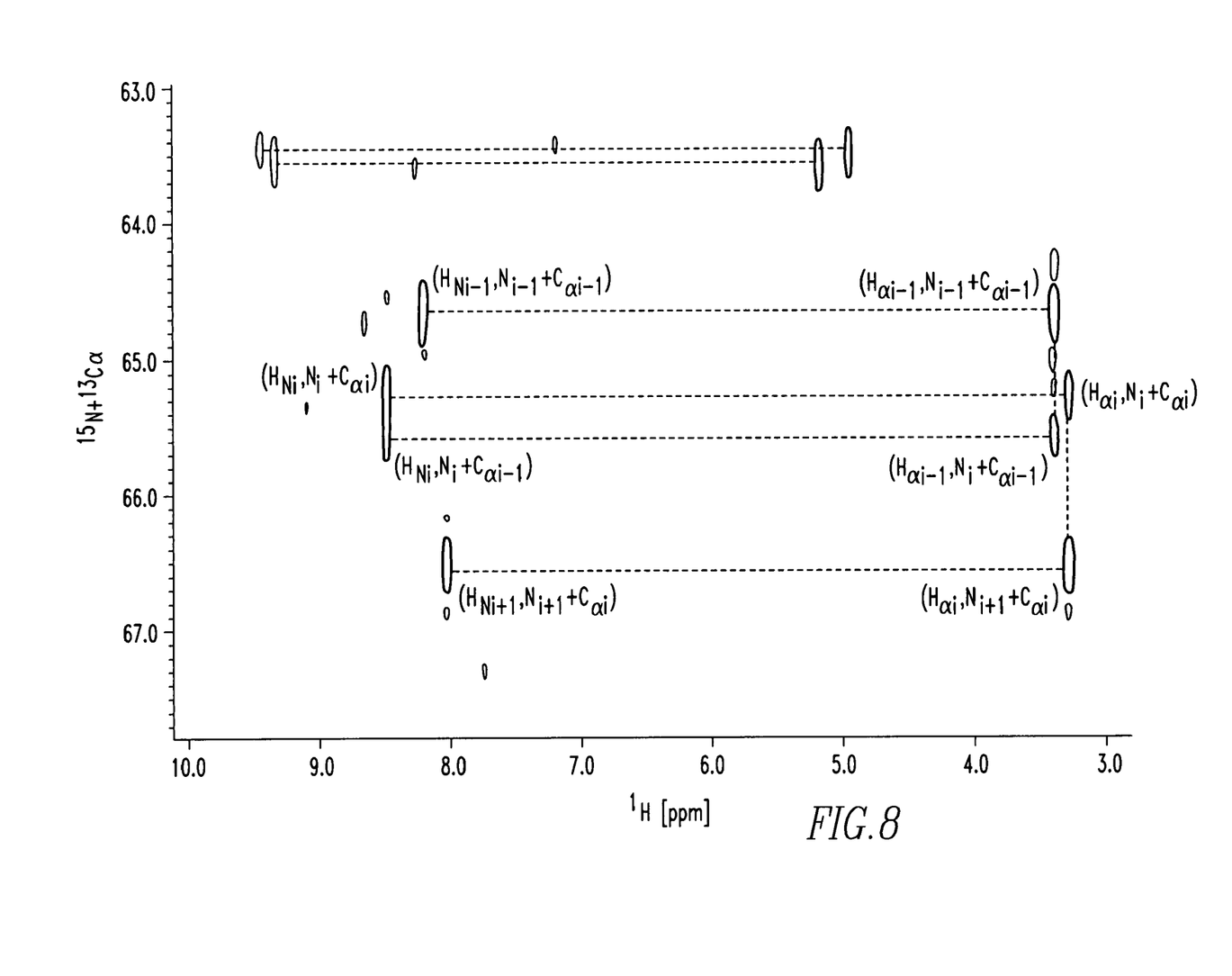
FIG. 8 is an enlarged diagram of a bottom portion of FIG. 7, illustrating the results of a measurement of chlorella ubiquitin by a measuring method according to the present invention.
Figure 9A:
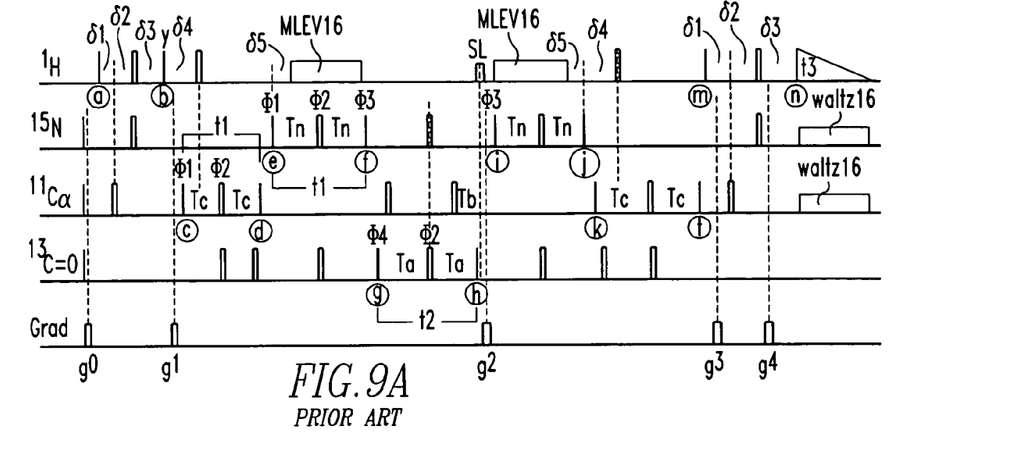
FIGS. 9A to 9F are diagrams of a pulse sequence proposed by Pang et al.
Figure 9B:
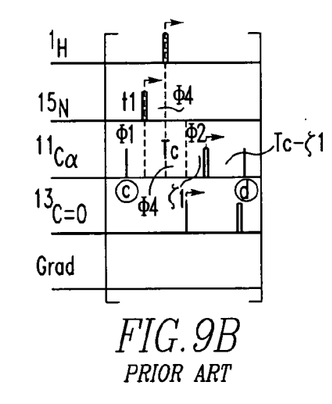
Figure 9C:
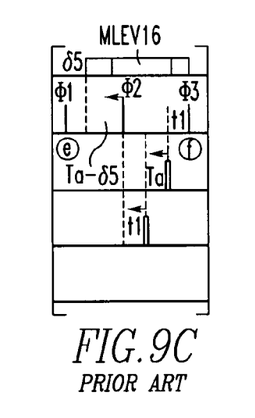
Figure 9D:
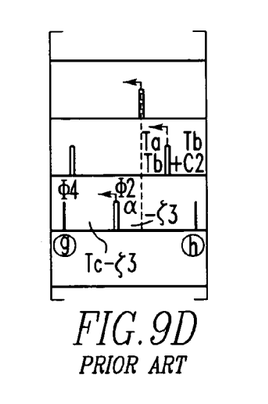
Figure 9E:
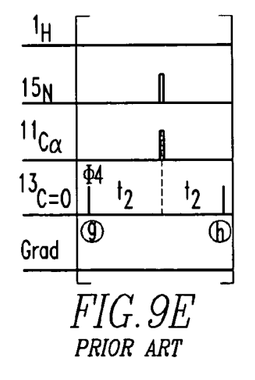
Figure 9F:
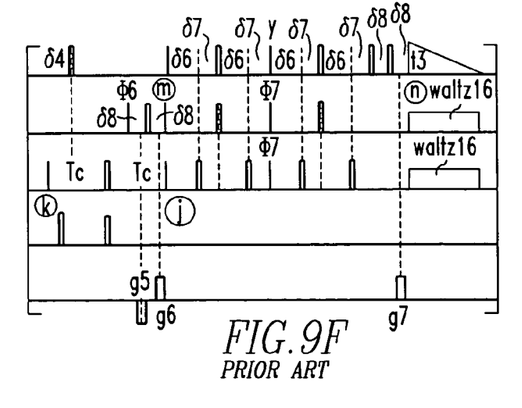

Chlorella ubiquitin was measured in practice by this method of measurement. The results are shown in FIGS. 7 and 8. FIG. 7 shows the results of a measurement performed using the pulse sequence of FIG. 5. FIG. 8 is an enlarged diagram of a bottom portion 200 of FIG. 7.

Embodiment 3

Embodiment 3 is also a specific example of an experiment for observing signals of magnetizations transferred along two pathways through a protein or peptide by a method of pulsed NMR spectroscopy using the pulsed NMR spectrometer 1.

Embodiment 3 is especially used for an experiment for finding correlations using the residual dipolar coupling between residual dipoles $^{13}C$ or $^{15}N$ in a compound labeled with stable isotope $^{13}C$ or $^{15}N$. The pulsed NMR spectrometer 1 used in this Embodiment 3 produces a measuring magnetic field set, for example, to 14.1 T (600 MHz when converted into a proton resonance frequency). This spectrometer 1 is similar in configuration with the pulsed NMR spectrometer 1 already described in connection with FIG. 1. The NMR instrument of 600 MHz has two or more independent output sections 30 and 30'. Each of the output sections includes a frequency synthesizer, a transmitter, and a power amplifier. The output sections cover 150.8 MHz of $^{13}C$ and 60.8 MHz of $^{15}N$. The instrument has a transmit-receive coil (probe) 11 capable of measuring signals of 150.8 MHz of $^{13}C$ and 60.8 MHz of $^{15}N$. The sample to be investigated is labeled with stable isotope $^{13}C$ or $^{15}N$.

The operation of Embodiment 3 is described. Information about correlations of the residual dipolar couplings (RDCs) can be obtained using this pulsed NMR spectrometer 1 under the presence of liquid crystal or phage.

That is, when magnetizations of nuclei A and B are coupled by residual dipolar coupling, modulation due to the residual dipolar coupling changes in-phase magnetization of the nucleus A or in-phase magnetization of the nucleus B into antiphase magnetization of the nucleus A coupled to the nucleus B by residual dipolar coupling or into antiphase magnetization of the nucleus B coupled to the nucleus A by residual dipolar coupling.

The antiphase magnetization of the nucleus A coupled to the nucleus B by residual dipolar coupling and antiphase magnetization of the nucleus B coupled to the nucleus A by residual dipolar coupling can be interchanged by applying a 90° pulse to the nucleus A and a 90° pulse to the nucleus B at the same time.

Furthermore, in-phase magnetization of the nucleus B or in-phase magnetization of the nucleus A can be obtained by modulating the interchanged magnetizations by the residual dipolar coupling from antiphase magnetization to in-phase magnetization. Consequently, the magnetizations of the nuclei A and B can be interchanged.

The basic portion of the pulse sequence for simultaneously carrying out exchange of the magnetizations between the nuclei A and B and evolution of the residual dipolar coupling is identical with the portion already described in connection with FIG. 2. Desired magnetization transfer and evolution of the residual dipolar coupling can be carried out simultaneously by appropriately inserting this pulse sequence into the other pulse sequence. Unlike in the case of Embodiment 1, modulation is performed by evolution of time T as an indirect observation axis in cases of experiments of Embodiment 3.

The basic portion of the pulse sequence is composed of a former half portion (1), a latter half portion (2), and an intervening portion. In the former half portion (1), in-phase magnetizations of $A_x$ or $A_y$ and $B_x$ or $B_y$ are caused to make a transition to antiphase magnetizations of $2A_yB_z$ or $2A_xB_z$ and $2B_yA_z$ or $2B_xA_z$, using RF pulses 61, 62 and 71, 72. In the subsequent intermediate portion between (1) and (2), using 90° RF pulses 63 and 73, the antiphase magnetizations are interchanged ($2A_yB_z$ or $2A_xB_x \rightarrow 2A_zB_y$ or $2A_zB_x$ and $2B_yA_z$ or $2B_xA_z \rightarrow 2B_zA_y$ or $2B_zA_x$). In the latter half portion (2), using the RF pulses 64, 65, 74, and 75, a transition is made from antiphase magnetizations of $2A_zB_y$ or $2A_zB_x$ and $2B_zA_y$ or $2B_zA_x$ to in-phase magnetizations $B_x$ or $B_y$ and $A_x$ or $A_y$.

In FIG. 2, the residual dipolar coupling is evolved by the constant-time evolution technique simultaneously with exchange of nuclear magnetizations. Since the magnetizations of both nuclei A and B are in state of lateral magnetization in the former half portion (1) and latter half portion (2), evolution of the residual dipolar coupling can be done simultaneously.

Therefore, two magnetization transfer pathways can be evolved simultaneously by a technique of residual dipolar coupling by making a measurement using the above-described pulse sequence.

Furthermore, in this experiment, the phases of the RF pulses are varied during two accumulation processes. Consequently, evolutions of the residual dipolar couplings, respectively, in the former half portion (1) and latter half portion (2) are detected in quadrature as signals of evolutions of sums of the residual dipolar couplings. The observed interferogram of the real part is given by:

cos modulation(residual dipolar coupling of nucleus A or B) of (1) × cos modulation(residual dipolar coupling of nucleus B or A) of (2) − sin modulation(residual dipolar coupling of nucleus A or B) of (1) × sin modulation(residual dipolar coupling of nucleus B or A) of (2).

The observed interferogram of the imaginary part is given by:

cos modulation(residual dipolar coupling of nucleus A or B) of (1) × sin modulation(residual dipolar coupling of nucleus B or A) of (2) + sin modulation(residual dipolar coupling of nucleus A or B) of (1) × cos modulation(residual dipolar coupling of nucleus B or A) of (2).

As a result, cos modulation of (1)+(2) (residual dipolar coupling of nucleus A+residual dipolar coupling of nucleus B) and sin modulation of (1)+(2) (residual dipolar coupling of nucleus A+residual dipolar coupling of nucleus B) are obtained.

In the pulse sequence of FIG. 2, to facilitate discriminating between the peaks passed through the two pathways, the phase of the $QD_1$ is reversed between the nuclei A and B such that when one is observed as a positive peak, the other is observed as a negative peak.

Embodiment 4

When used in an experiment for finding the correlations by making use of residual dipolar coupling between amide nitrogen ($^{15}N$) and alpha carbon ($^{13}C_\alpha$) in a protein or peptide labeled with stable isotope $^{13}C$ or $^{15}N$, the pulsed NMR spectrometer produces a measuring magnetic field set, for example, to 14.1 T (600 MHz when converted into a proton resonance frequency). The NMR spectrometer 1' used in this Embodiment 4 is similar in configuration with the pulsed NMR spectrometer already described in connection with FIG. 1 except for the capabilities of the frequency synthesizer 31' of the output section 30' and probe 11' inside the magnet.

The output section 30' emits three or more frequencies which cover 600.0 MHz of $^1H$, 150.8 MHz of $^{13}C$, and 60.8 MHz of $^{15}N$.

The probe 11' detects a signal of $^1H$ (600.0 MHz) and a frequency lock signal of $^2H$ (92.1 MHz). An example of the investigated sample is a protein or peptide labeled with stable isotope $^{13}C$ or $^{15}N$.

The operation of Embodiment 4 is described. It is possible to obtain information regarding correlations of residual dipolar couplings (RDCs) under the presence of a liquid crystal or phage, using a solution NMR spectrometer.

In the case of amino acid residue within a protein or peptide labeled with stable isotope $^{13}C$ or $^{15}N$ of Embodiment 4, such a state of residual dipolar coupling can be created between $^{13}C_\alpha$ nucleus and $^{15}N$ nucleus in the same way as in Embodiment 3.

By evolving the time T within the pulse sequence of FIG. 5 as an indirect observation axis, the magnetization is transferred in the route: $^{15}N$ (amide nitrogen)→$^{13}C_\alpha$ (alpha carbon)→$^1H_\alpha$ (alpha proton). At the same time, information can be obtained under the condition where evolution is performed using the residual dipolar coupling of $^{15}N$ and the residual dipolar coupling of $^{13}C_\alpha$ as indirect observation axes.

Furthermore, in measurements using the pulse sequence of FIG. 2, signals of magnetizations following the route $^1H_\alpha$→$^{13}C_\alpha$→$^{15}N$→$^1H_N$ can be observed as negative peaks. Signals of magnetizations following two pathways within the same measurement period are simultaneously obtained.

According to the NMR spectrometer and NMR measurement method of the present embodiment used in experiments of Embodiments 1-4 described so far, during NMR peak assignments of proteins and peptides, spectra multi-dimensionalized by magnetization transfer of J-coupling are used in assigning NMR peaks of proteins and peptides. In this case, with the prior art technique, evolution of chemical shifts of a single nuclide has been done while transferring magnetization in a certain direction, thus deriving information about the chemical shifts of the certain nuclide along the certain route followed by magnetization. According to the present invention, evolutions of two kinds of chemical shifts which have been heretofore observed as different indirect observation axes are done simultaneously. Also, magnetizations are transferred along two pathways simultaneously. All of these processes can be performed in one experiment. The time taken to collect data can be reduced greatly. As shown in Embodiment 2, in the prior art method of performing measurements of proteins and peptides, two three-dimensional measurements are carried out to obtain an equivalent amount of information. The present invention makes it possible to collect an amount of information necessary for sequential assignment only by a two-dimensional measurement. A measurement time of tens of hours is required to perform a normal single three-dimensional measurement. According to the present invention, the measurement time can be shortened to a few hours.

In addition, in experiments for observing signals of magnetizations passed through plural routes, correlations among peaks can be easily analyzed with a spectrum of lower dimensionality.

Further, in experiments for observing signals of magnetizations passed through plural routes, the signals can be obtained with high sensitivity in a short time.

Additionally, in the prior art method, it has been necessary to process three-dimensional data by a computer for NMR peak assignments. The present invention makes it possible to make an analysis only with two-dimensional data. Consequently, a work for NMR data assignments can be performed on only one sheet of paper.

Having thus described our invention in the detail and particularity required by the Patent Laws, what is desired protected by Letters Patent is set forth in the following claims.

The invention claimed is:

1. A method of multidimensional NMR measurement, comprising the steps of applying first transition, intermediate exchanging and second transition pulse sequences and detecting plural time-modulated magnetization transfer pathways simultaneously if such plural magnetization transfer pathways exist from excitation of magnetization to observation,
    wherein said plural magnetization transfer pathways includes at least a first magnetization transfer pathway going from a first nucleus to a second nucleus and a second magnetization transfer pathway going from the second nucleus to the first nucleus, with the magnetization transfer caused by at least one of J-coupling and dipole-dipole interaction, and wherein time modulations of the at least first and second magnetization transfer pathways are observed simultaneously, with the time modulation caused by evolution of chemical shifts or residual dipolar couplings.

2. The method of multidimensional NMR measurement as set forth in claim 1, wherein said first nucleus is peptide-coupled amide $^{15}N$ nucleus, while said second nucleus is peptide-coupled $^{13}C$ nucleus in the alpha position.

3. The method of multidimensional NMR measurement according to claim 1, comprising:
    providing a first pulse sequence for making a transition from in-phase magnetization of a first nucleus or in-phase magnetization of a second nucleus magnetically coupled to said first nucleus to antiphase magnetization of said first nucleus magnetically coupled to said second nucleus or antiphase magnetization of said second nucleus coupled to said first nucleus;

providing a second pulse sequence for exchanging the antiphase magnetization of said first nucleus coupled to said second nucleus or the antiphase magnetization of said second nucleus coupled to said first nucleus for the antiphase magnetization of said second nucleus coupled to said first nucleus or the antiphase magnetization of said first nucleus coupled to said second nucleus, said second pulse sequence succeeding said first pulse sequence; and providing a third pulse sequence for making a transition from the antiphase magnetization of said second nucleus coupled to said first nucleus or the antiphase magnetization of said first nucleus coupled to said second nucleus to the in-phase magnetization of said second nucleus coupled to said first nucleus or the in-phase magnetization of said first nucleus coupled to said second nucleus, said third pulse sequence succeeding said second pulse sequence, wherein said first and third pulse sequences cause evolution of chemical shifts for a given period.

4. The method of multidimensional NMR measurement according to claim 3, wherein said first nucleus is peptide-coupled amide $^{15}N$ nucleus, while said second nucleus is peptide-coupled $^{13}C$ nucleus in the alpha position.

5. The method of multidimensional NMR measurement according to claim 3, wherein during measurement of peptide coupling, said first pulse sequence induces a transition from in-phase magnetization of $^{15}N$ to antiphase magnetization of $^{15}N^{13}C_\alpha$ (where N is amide nitrogen nucleus of peptide coupling and $^{13}C_\alpha$ is carbon nucleus of peptide coupling in the alpha position) and, at the same time, induces a transition from in-phase magnetization of $^{13}C_\alpha$ to antiphase magnetization of $^{13}C_\alpha{}^{15}N$.

6. The method of multidimensional NMR measurement according to claim 3, wherein during measurement of peptide coupling, said second pulse sequence induces a transition from antiphase magnetization of $NC_\alpha$ to antiphase magnetization of $^{13}C_\alpha{}^{15}N$ (where $^{15}N$ is amide nitrogen nucleus of peptide coupling and $^{13}C_\alpha$ is carbon nucleus of peptide coupling in the alpha position) and, at the same time, induces a transition from antiphase magnetization of $^{13}C_\alpha{}^{15}N$ to antiphase magnetization of $^{15}N^{13}C_\alpha$.

7. The method of multidimensional NMR measurement according to claim 3, wherein during measurement of peptide coupling, said third pulse sequence induces a transition from antiphase magnetization of $^{13}C_\alpha{}^{15}N$ to in-phase magnetization of $^{13}C_\alpha$ (where $^{15}N$ is amide nitrogen nucleus of peptide coupling and $^{13}C_\alpha$ is carbon nucleus of peptide coupling in the alpha position) and, at the same time, induces a transition from antiphase magnetization of $^{15}N^{13}C_\alpha$ to in-phase magnetization of $^{15}N$.

8. The method of multidimensional NMR measurement according to claim 4, wherein during measurement of peptide coupling, said first pulse sequence induces a transition from in-phase magnetization of $^{15}N$ to antiphase magnetization of $^{15}N^{13}C_\alpha$ (where N is amide nitrogen nucleus of peptide coupling and $^{13}C_\alpha$ is carbon nucleus of peptide coupling in the alpha position) and, at the same time, induces a transition from in-phase magnetization of $^{13}C_\alpha$ to antiphase magnetization of $^{13}C_\alpha{}^{15}N$.

9. The method of multidimensional NMR measurement according to claim 4, wherein during measurement of peptide coupling, said second pulse sequence induces a transition from antiphase magnetization of $NC_\alpha$ to antiphase magnetization of $^{13}C_\alpha{}^{15}N$ (where $^{15}N$ is amide nitrogen nucleus of peptide coupling and $^{13}C_\alpha$ is carbon nucleus of peptide coupling in the alpha position) and, at the same time, induces a transition from antiphase magnetization of $^{13}C_\alpha{}^{15}N$ to antiphase magnetization of $^{15}N^{13}C_\alpha$.

10. The method of multidimensional NMR measurement according to claim 4, wherein during measurement of peptide coupling, said third pulse sequence induces a transition from antiphase magnetization of $^{13}C_\alpha{}^{15}N$ to in-phase magnetization of $^{13}C_\alpha$ (where $^{15}N$ is amide nitrogen nucleus of peptide coupling and $^{13}C_\alpha$ is carbon nucleus of peptide coupling in the alpha position) and, at the same time, induces a transition from antiphase magnetization of $^{15}N^{13}C_\alpha$ to in-phase magnetization of $^{15}N$.

* * * * *

UNITED STATES PATENT AND TRADEMARK OFFICE
CERTIFICATE OF CORRECTION

PATENT NO. : 7,605,001 B2
APPLICATION NO. : 11/265039
DATED : October 20, 2009
INVENTOR(S) : Takasugi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 979 days.

Signed and Sealed this

Fifth Day of October, 2010

David J. Kappos
*Director of the United States Patent and Trademark Office*